United States Patent [19]

Tanaka

[11] Patent Number: 4,668,077
[45] Date of Patent: May 26, 1987

[54] PROJECTION OPTICAL APPARATUS

[75] Inventor: Hiroshi Tanaka, Yokohama, Japan

[73] Assignee: Nippon Kogaku K. K., Tokyo, Japan

[21] Appl. No.: 749,438

[22] Filed: Jun. 27, 1985

[30] Foreign Application Priority Data

Jul. 5, 1984 [JP] Japan .................. 59-139536

[51] Int. Cl.⁴ ............................. G03B 27/52
[52] U.S. Cl. ........................ 355/30; 355/53; 355/43
[58] Field of Search ............... 355/53, 43, 30

[56] References Cited

U.S. PATENT DOCUMENTS 4,497,015 7/1985 Konno et al. ............... 362/268
4,498,742 7/1985 Uehara .................. 350/523

FOREIGN PATENT DOCUMENTS 151936 9/1982 Japan ...................... 355/30

Primary Examiner—Monroe H. Hayes
Attorney, Agent, or Firm—Shapiro and Shapiro

[57] ABSTRACT

An optical apparatus for projecting the pattern of a photomask comprises light source means emitting radiation, an illuminating optical system for condensing the radiation from the light source means on the photomask, a projection optical system provided between the photomask and a predetermined plane to cause the pattern of the photomask illuminated by the illuminating optical system to be imaged on the predetermined plane, the projection optical system having an imaging optical characteristic varied by the radiation having entered through the photomask, thermometric means including a temperature detecting element producing an output corresponding to a temperature detected thereby, the thermometric means causing part of the radiation directed to the projection optical system by the illuminating optical system to act on the temperature detecting element, and means for producing an output signal corresponding to a variation in the imaging optical characteristic of the projection optical system on the basis of the output of the temperature detecting element.

10 Claims, 7 Drawing Figures

PROJECTION OPTICAL APPARATUS

BACKGROUND OF THE INVENTION

1. Field of the Invention

This invention relates to a projection optical system, and in particular to an apparatus for correcting an optical characteristic thereof.

2. Description of the Prior Art

Reduction projection type exposure apparatuses called steppers have been much introduced into the production field of super-LSI in recent years and have been crowned with great success, and resolving power may be mentioned as one of the important performances thereof. One of important factors which affect this resolving power is the positional deviation of the imaging plane of the projection optical system in the direction of the optic axis. The size of the pattern used in super LSI has been strengthening its tendency toward minuteness year by year and correspondingly, the need for the improvement of the resolving power has been strengthening. Accordingly, the necessity of keeping the imaging plane at a predetermined position has become very high.

The position of the imaging plane of the projection optical system is adjusted during the manufacture or assembly of the apparatus to such a degree that the imaging plane can be neglected. However, the projection lens of the stepper absorbs part of the exposure energy and rises in temperature. Therefore, if light energy continues to be applied to the projection lens for a long time or the exposure operation is continuously performed for a long time, the position of the imaging plane moves to a significant degree. Likewise, the magnification of the projection lens also varies. Therefore, in a stepper used for the exposure of more minute patterns, those fluctuations must be made sufficiently small.

SUMMARY OF THE INVENTION

It is an object of the present invention to provide an apparatus for detecting the fluctuation of the imaging optical characteristic of a projection optical system brought about by the energy of illuminating light.

It is another object of the present invention to provide a projection optical apparatus for self-correcting imaging optical characteristic relative to any variation in temperature brought about by energy.

The projection optical apparatus of the present invention includes an illuminating optical system for applying the illuminating light from a light source to a mask, a projection optical system for projecting the pattern of the mask, temperature detecting means provided at a position in the optical path from the light source to the projection optical system for receiving the light energy from the light source, and detecting means for finding the amount of variation in the imaging optical characteristic of the projection optical system caused by the incidence of the illuminating light, on the basis of the detection signal of the temperature detecting means.

In a preferred embodiment of the present invention, the temperature detecting means includes a temperature sensor which puts out a detection signal having a time constant substantially coincident with the time constant of the image plane movement characteristic of the projection optical system. Said temperture sensor is held by a holding member of selected mass and material for the adjustment of said time constant.

Where a shutter for intermittently passing light therethrough is provided between said light source and said projection optical system, the temperature detecting means should preferably be disposed rearwardly of the shutter. Thereby, irrespective of the opening and closing of the shutter, the detected temperature by the temperature detecting means is substantially coincident with the image plane movement characteristic.

DESCRIPTION OF THE PREFERRED EMBODIMENTS

Figure 1:
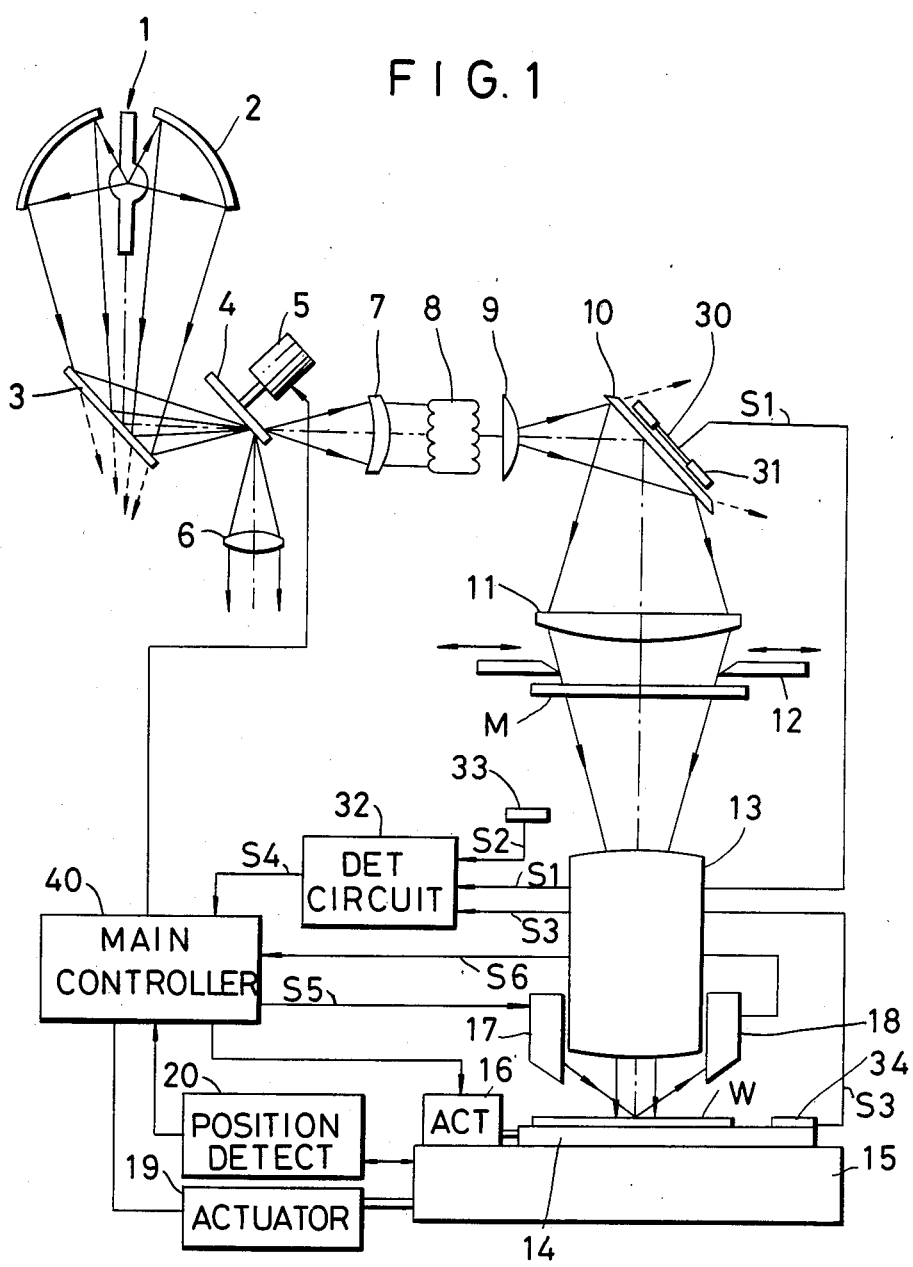
FIG. 1 schematically shows the construction of a projection type exposure apparatus according to a first embodiment of the present invention.

FIG. 1 schematically shows the construction of a projection optical apparatus according to a first embodiment of the present invention. A light source 1 such as a super-high pressure mercury discharge lamp is disposed so that the calescence point thereof is positioned at a first focus of an elliptical reflecting mirror 2. The light beam condensed by the elliptical reflecting mirror 2 enters a dichroic mirror 3 which reflects a light of a single wavelength (for example, g-line) effective to sensitize a photosensitive agent on a wafer and transmits therethrough light of greater wavelengths (including heat radiation in addition to e-line, d-line, etc.). The illuminating light reflected by the dichroic mirror 3 is condensed at a second focus of the elliptical reflecting mirror 2 and substantially forms a point source of light. A rotary shutter 4 is disposed at said second focus position at an angle of 45° with respect to the optic axis and alternately changes over the transmission and interception of the illuminating light by the driving of a motor 5. This rotary shutter 4 is a metal disc having apertures formed circumferentially equidistantly, and the portion between adjacent apertures acts as a mirror-surfaced shutter blade. When the blades of the shutter 4 are positioned in the optical path, the illuminating light from the light source 1 is reflected by the blades and directed to an optical system 6 for illuminating an unshown alignment microscope within the apparatus. When the apertures of the shutter 4 are positioned in the optical path, the illuminating light arrives at an input lens 7. The input lens 7 collimates the illuminating light. An optical integrator 8 may be one shown, for example, in U.S. Pat. No. 4,497,015, and the collimated light beam enters the optical integrator 8 and forms a number of secondary light source images on the exit surface side thereof. The illuminating light passed through an output lens 9 is reflected at a right angle by a dichroic mirror 10, enters a condenser lens 11 and illuminates a mask or reticle (hereinafter generally referred to as the mask) M with a uniform light intensity distribution. The dichroic mirror 10 has a spectral characteristic of reflecting an exposure light of a single wavelength effective for the exposure of the photosensitive agent and transmitting light of longer wavelengths. Both of the first dichroic mirror 3 and the second dichroic mirror 10 have a characteristic of reflecting all of light of strictly g-line and shorter wavelengths and transmitting all of light of longer wavelengths (including heat radiation). Therefore, light of long wavelengths not used for the exposure is almost cut off by the first dichroic mirror 3, but actually small amounts of light of long wavelengths is not cut off and arrives at the dichroic mirror 10. The quantity of such light is determined by the wavelength selecting characteristic of the dichroic mirror. Accordingly, depending on that characteristic, a slight quantity of the exposure light is sometimes transmitted through the dichroic mirror 10 and irradiates a temperature sensor 30. A blind 12 acting as a field stop for adjusting the illuminating area of the illuminating light for the mask M is disposed between the condenser lens 11 and the mask M. A projection lens system 13 is aberration-corrected with respect to the wavelength of the exposure light, and has a reduction magnification of the order of 1/5 or 1/10, for example, and forms the optical image of the pattern of the illuminated mask M on the photosensitive layer of the wafer W. A pattern having a clear contrast is formed on the mask M and therefore, a reduced image corresponding to that pattern is transferred to the photosensitive layer of the wafer W. A wafer holder 14 which vacuum-adsorbs the wafer W is provided on a stage 15 two-dimensionally movable in the direction of the surface thereof. Also, the wafer holder 14 is shifted in the direction of the optic axis of the projection lens 13 by an actuator 16 fixed to the stage 15, whereby focusing is accomplished.

Detection of defocusing is accomplished by a projector 17 for obliquely projecting a slit image onto the surface of the wafer and a light receiver 18 for receiving the reflected image of the slit image from the surface of the wafer and detecting the amount of deviation from a predetermined light receiving position. The defocusing detecting system comprising the projector 17 and the light receiver 18 will later be described in detail. The stage 15 is moved by an actuator 19 and the two-dimensional positions thereof are successively measured by a position detector 20.

Now, in the present embodiment, the temperature sensor 30 is disposed on the back side of the dichroic mirror 10 to detect any variation in the imaging optical characteristic of the projection lens system 13, particularly, the movement of the imaging plane. The temperature sensor 30 is mounted on a holding fitting 31 and is provided in very slightly spaced apart relationship with the dichroic mirror 10 so as not to contact the latter. This temperature sensor 30 receives chiefly the application of light of wavelengths (including heat radiation) other than the exposure light, of the light energy from the light source 1, and logarithmically rises in temperature with lapse of the application time on the basis of a heat capacity (or a time constant in the heat transfer characteristic) determined by the total of its own mass and the mass of the holding fitting 31, and puts out a detection signal S1 corresponding to that temperature.

In the present embodiment, an experiment in which the exposure light is caused to enter the projection lens system 13 and the position of the imaging plane in the direction of the optic axis is detected for each predetermined time has been carried out to find the moving characteristic of the image plane indicative of a logarithmic variation, and the mass of the holding fitting 31, for example, is adjusted so that said moving characteristic and the logarithmic variation in the level of the detection signal S1 primarily correspond to each other. Generally, the projection lens system 13 of this type has such a characteristic that the acceleration of the image plane movement is great at the start of incidence of the exposure light and the acceleration gradually becomes smaller with time and when a certain time elapses, the acceleration becomes stable at a saturation point whereat the image plane movement does not occur even if the exposure light further continues to enter. So, actually, the heat capacity determined by the temperature sensor 30, the holding fitting 31, etc. is adjusted so that the time constant of the logarithmic variation in the level of the detection signal S1 is coincident with the time constant of the image plane movement. It is by the following reasons that the temperature sensor 30 is provided at this position:

(1) In the optical path from the light source 1 to the projection lens system 13, it can directly receive the light energy from the light source 1 (including light of the other wavelengths than g-line and heat radiation) without intercepting the substantial optical path of the exposure light (g-line light); and (2) Since it is after the light has passed through the shutter 4, the detection signal S1 corresponding to the integrated quantity of energy of the exposure light entering the projection lens system 13 is obtained even without the time during which the shutter 4 is opened, the time during which the shutter 4 is closed, the duty thereof, etc. being taken into account.

The detection signal S1 is input to a detecting circuit 32 for detecting the amount of movement of the image plane. The detecting circuit 32 further receives as inputs a detection signal S2 from a temperature sensor 33 for monitoring the environmental temperature and a photoelectric signal S3 from a light-receiving element 34 provided on the wafer holder 14 and having a light-receiving surface larger than the projected image of the mask, and calculates the amount of movement of the image plane by a predetermined operation. The calculated result is input as information S4 to a main controller 40. The main controller 40 puts out a driving signal to an actuator 16 so as to correct the height of the wafer holder 14 from moment to moment in accordance with the information S4 and also puts out an offset signal S5 to the projector 17 to correct the defocusing detecting system correspondingly to the image plane movement. Also, the main controller 40 effects the control of the so-called automatic focusing operation which servo-controls the actuator 16, on the basis of a defocusing signal S6 from the light receiver 18. Further, the main controller 40 effects the control of the operation of servo-controlling an actuator 19 and positioning the stage 15 at a target position and the operation of driving the motor 5 and opening and closing the shutter 4.

Figure 2:
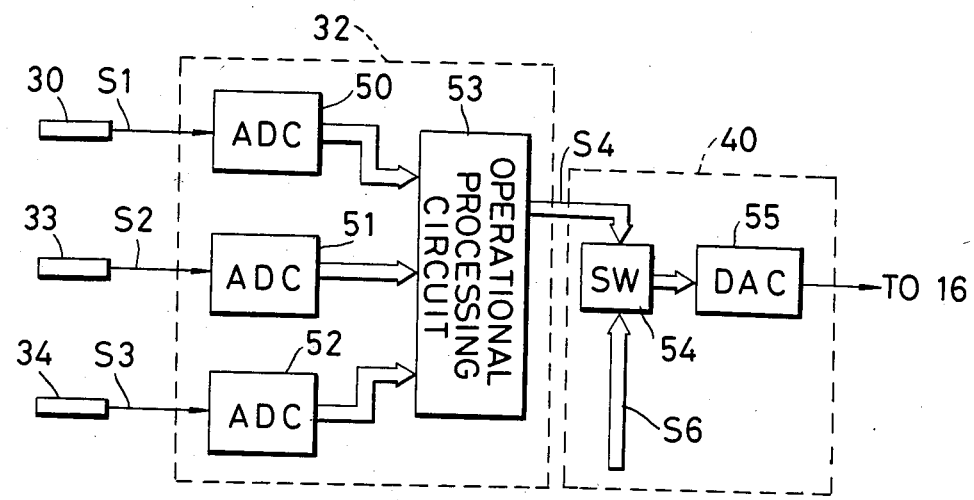
FIG. 2 is a block diagram of a detecting circuit.

FIG. 2 is a specific circuit block diagram of some portions of the detecting circuit 32 and main controller 40. The detection signal S1 of the temperature sensor 30, the detection signal S2 of the temperature sensor 33 and the photoelectric signal S3 of the light-receiving element 34 are input to analog-digital converters (ADCs) 50, 51 and 52, respectively, and are converted into binary information.

An operational processing circuit 53 receives the binary information as input, detects the amount of movement of the image plane and also determines the amount of shift of the waferholder 14 necessary to correct the image plane movement and puts out the amount of shift as correction information S4. The information S4 is input to a digital-analog converter (DAC) 55 through a change-over switch 54 provided in the main controller 40 and is converted into an analog value thereby, and then is applied to the actuator 16. The change-over switch 54 selectively changes over the binary information S6 of defocusing from the light receiver 18 and the information S4 and applies them to the DAC 55.

Figure 3:
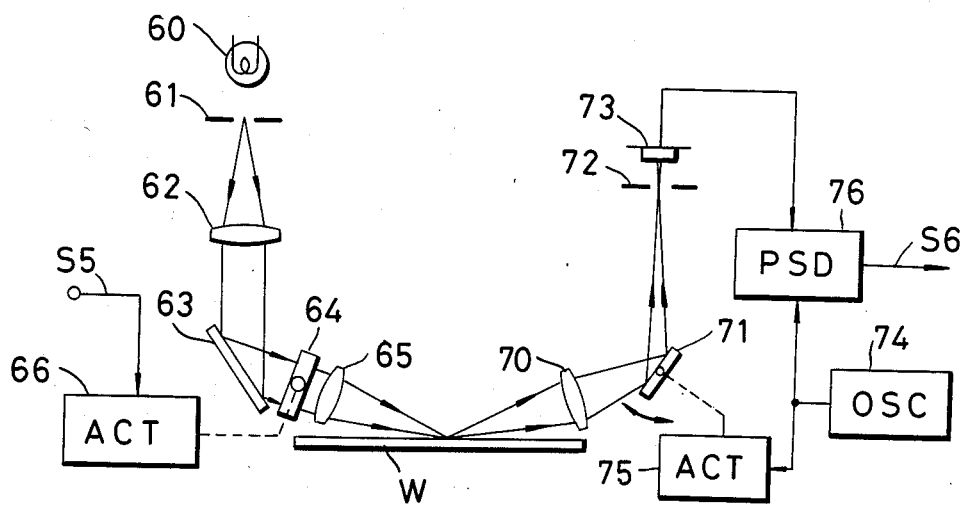
FIG. 3 is a schematic view showing a defocus detecting system.

FIG. 3 shows the specific construction of a focus detecting system. The projector 17 is provided with a light source 60 emitting, for example, infrared light of a wavelength which does not sensitize the photosensitive agent of the wafer W, a plate 61 having a slit illuminated by the light source 60, a lens 62 for collimating the light passed through the slit, a mirror 63 for bending the light beam, a parallel flat glass plate 64, and a lens 65 for converging the collimated light beam and forming the image of the slit on the wafer. The parallel flat glass plate 64 is turned about an axis orthogonal to the optic axis and extending in a direction parallel to the surface of the wafer by an actuator 66 and shifts the imaged position of the image of the slit. How much the imaged position should be shifted relative to the surface of the wafer is based on the offset signal S5 from the main controller 40. On the other hand, the light receiver 18 is provided with a lens 70 for converging the reflected light of the slit image projected onto the surface of the wafer, a mirror 71 vibrated at a predetermined angular frequency, a plate 72 having a slit provided at the imaged position of the reflected light converged by the lens 70, and a photoelectric element 73 for receiving the light transmitted through the slit and putting out a photoelectric signal corresponding to the quantity of said light. An oscillator (OSC) 74 puts out an oscillation signal for vibrating the vibratory mirror 71 to a driving portion 75 and a synchronous detecting circuit (PSD) 76. Therefore, the vibratory mirror 71 is vibrated at the frequency of the oscillation signal of the OSC 74, and the PSD 76 synchronously detects the photoelectric signal by the oscillation signal. Accordingly, when the slit and the center of vibration of the slit image have become coincident with each other, that is, when in the in-focus state, the PSD 76 assumes a zero level, and when the slit and the center of vibration of the slit image deviate from each other, that is, when in the non-in-focus state, the PSD 76 puts out as a defocus signal S6 a signal of a polarity corresponding to the direction of the deviation and representative of an analog value corresponding to the magnitude thereof.

Operation of the present embodiment will now be described. In the operational processing circuit 53 shown in FIG. 2, there are pre-stored a constant K representative of the primary relation between the temperature $T_1$ detected by the temperature sensor 30 and the amount of deviation $\Delta F$ of the actual image plane from its initial position and the program of a predetermined operational equation. Determination of the constant K will be described. Determination of this constant is effected during the assembly of the apparatus or during the adjustment after the completion of the apparatus. The projection lens system 13 and the defocus detecting system 17, 18 are first adjusted into their ideal state, whereafter the shutter 4 is left closed until the temperature of the various parts (particularly the projection lens system 13) of the apparatus reaches a predetermined temperature (for example, the temperature 25° C. in a clean room). The predetermined temperature is stored as the initial temperature $T_0$ in the operational processing circuit 53. Subsequently, a test mask whose average transmittance is known is mounted on the apparatus. A check pattern for measuring the resolving power is made on this test mask. The shutter 4 is opened, the check pattern is projected onto the wafer W, and the wafer is tentatively exposed to light.

Figure 4:
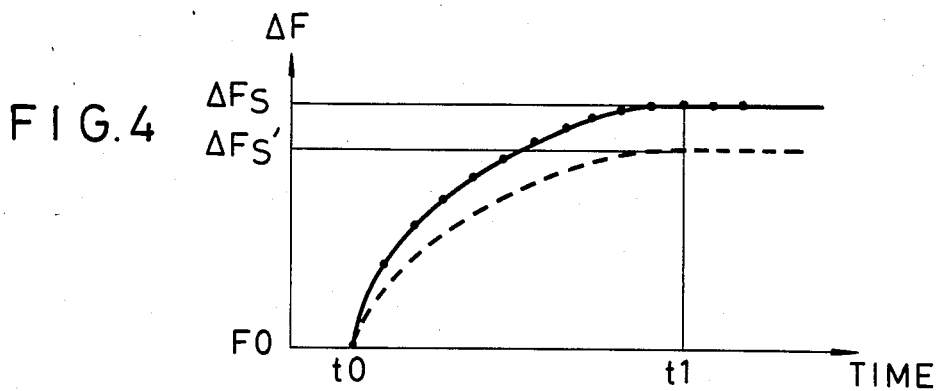
FIG. 4 is a graph showing the variation with time in the amount of deviation of the image plane.
Figure 5:
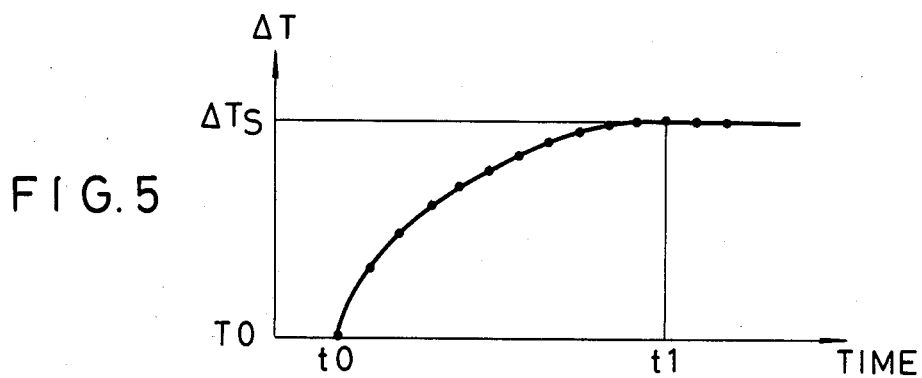
FIG. 5 is a graph showing the variation with time in temperature.

The tentative exposure of the wafer includes the process of repetitively projecting the pattern of the test mask onto a plurality of areas on the wafer. Thereupon, during each projection onto each area, the wafer is moved by a minute pitch in the direction of the optic axis of the projection lens system. During each repetitive projection, the detection signal S1 of the temperature sensor 30 is stored. When the exposure of a wafer is thus completed, the wafer is unloaded and the test mask is also unloaded, and the blind 12 is fully opened and the shutter 4 is left in its open state for one to five minutes. Thereafter, a new wafer is again loaded and the test exposure and the storage of the detection signal S1 are effected likewise. The above-described operation is repetitively carried out for thirty to sixty minutes. The wafer thus obtained is developed, and the state of the left photosensitive agent is observed to effect the inspection of the resolving power, i.e., the best focus position. Thereby, the characteristic of the amount of deviation $\Delta F$ of the image plane resulting from the incidence of the exposure light onto the projection lens system 13 and the temperature characteristic are actually measured as functions of time. An example thereof is shown in FIGS. 4 and 5. At time $t_0$, the test exposure is started, and at time $t_1$, the movement of the imaging plane and the variation in temperature are stabilized. The two characteristics exhibit a logarithmic variation and the time constants thereof are adjusted so as to coincide with each other and therefore, they can be regarded as similar as function curves. Thus, the ratio of the amount of deviation $\Delta FS$ of the image plane at time $t_1$ to the amount of variation $\Delta TS$ in temperature ($\Delta FS/\Delta TS$) is the constant K (the unit thereof being, for example, $\mu m/°$ C.), and this value is stored in the operational processing circuit 53.

When it is judged that there is a difference between the time constant $t\alpha$ of the image plane movement characteristic and the time constant $t\beta$ of the temperature variation characteristic, for example, when the time constant $t\beta$ is great relative to the time constant $t\alpha$, the mass of the holding member 31 may be adjusted so as to reduce the general heat capacity of the temperature sensor 30 and the holding member 31. In a converse case, the mass of the holding member 31 may be adjusted so that the general heat capacity of the temperature sensor 30 and the holding member 31 may be great. This adjustment can be achieved, for example, by the selection of the dimensions or the material of the holding member 31. When it is desired to make the heat capacity great, a similar effect may be obtained, for example, by sticking a small piece of an ND filter formed of a glass material or a metal piece on that side of the temperature sensor 30 which receives light energy, and further, it is also possible by making the spacing between the dichroic mirror 10 and the temperature sensor 30 great.

Also, it is desirable that the environmental temperature be constant during the measurement of $\Delta F$ and $\Delta T$, but in some cases, the environmental temperature may vary more or less. Therefore, if the value obtained by subtracting the detection signal S2 of the temperature sensor 33 from the detection signal S1 of the temperature sensor 30 is the amount of variation $\Delta T$, the error resulting from the variation in environmental temperature will be offset and a very accurate measurement result will be obtained.

In the above-described manner, the initial temperature $T_0$ of the temperature sensor 30 is also stored in the operational processing circuit 53. This initial temperature $T_0$ is usually set to the temperature of the environment in which the apparatus is installed.

It is experimentally known that the values of the above-mentioned saturation points $\Delta FS$ and $\Delta TS$ vary in proportion to each of the light intensity l of the light source, the area P of the pattern area of the mask and the transmittance $\eta$ in that area. So, exposure is effected tentatively, whereafter the test mask is unloaded and with the blind 12 and the shutter 4 being opened, the light-receiving element 34 is positioned just beneath the projection lens system 13, and the total quantity $I_0$ of the light passed through the projection lens system 13 is detected and the value thereof is stored in the operational processing circuit 53. If this is done, the saturation point $\Delta FS'$ during the mounting of an actual mask can be immediately found from the saturation point $\Delta FS$ for the total quantity of light $I_0$ simply by mounting that mask and detecting the quantity of light I applied to the light-receiving element 34.

There will now be described a case where a pattern is projected onto the wafer W by the use of an actual mask M. The stage 15 is positioned so that the light-receiving element 34 lies just beneath the projection lens system 13. The mask M is mounted and the blind 12 is closed so that the portion of the mask M other than the pattern area is shielded from light. In this state, the operational processing circuit 53 stores therein the value Ir of the photoelectric signal S3. Measurement and storage of the value Ir are effected each time the mask M is interchanged. Also, the ratio of the value Ir to I may be said to be the general transmittance regarding the mask M including the area P of the pattern area and the transmittance $\eta$. Now, if, at this time, the temperature $T_1$ detected by the temperature sensor 30 is coincident with the initial temperature $T_0$ stored in the operational processing circuit 53 during the manufacture or adjustment of the apparatus, movement of the image plane does not occur and therefore, corrective movement of the wafer holder 14 is not effected. Subsequently, the so-called step-and-repeat type exposure operation in which the stage 15 is caused to step by a predetermined pitch in the horizontal direction and the shutter 4 is opened for a predetermined time and the projection of the pattern of the mask M onto the wafer is repeated is initiated by the command from the main controller 40. When this repeated exposure is initiated, the temperature detected by the temperature sensor 30 also rises. That detected temperature includes the information of the intensity l of the light from the light source and the information of the portion of the opening time which the shutter 4 occupies within a unit time. During this exposure operation or during the interchange of the wafer W, the operational processing circuit 53 reads the detection signal S1 of the temperature sensor 30 and carries out the operation of the amount of deviation $\Delta F$ of the image plane by the following equation (1):

$$\Delta F = \Delta T \cdot (Ir/I) \cdot K = (T_1 - T_0) \cdot (Ir/I) \cdot K \tag{1}$$

This amount of deviation $\Delta F$ corresponds to the defocus caused by the incidence of the exposure light onto the projection lens system 13. The main controller 40 receives as input the information S4 corresponding to the amount of deviation $\Delta F$ and drives the actuator 16 so as to correct the deviation and automatically adjusts the wafer holder 14.

Specifically, the change-over switch 54 in FIG. 2 is selected to servo-control the actuator 16 so that the defocus signal S6 from the light receiver 18 becomes zero, and the surface of the wafer is adjusted to a predetermined position (the position of the imaging plane when $\Delta F = 0$). Thereafter, the change-over switch 54 is changed over and the position of the wafer holder 14 is corrected by the amount of deviation $\Delta F$ from the adjusted position. As an alternative method, the offset signal S5 may be put out from the main controller 40 and the parallel flat glass plate 64 shown in FIG. 3 may be inclined to correct the imaged position of the slit image projected onto the surface of the wafer by an amount equal to the amount of deviation $\Delta F$, whereafter the automatic focusing operation of the wafer surface may be effected on the basis of the defocus signal S6. In any case, during the operation of the exposure apparatus, the defocus resulting from the movement of the image plane of the projection lens system 13 is corrected at real time on the basis of only the temperature information detected by the temperature sensor 30.

The ambient temperature of the temperature sensor 30 may vary during the operation of the exposure apparatus. In that case, the value obtained by subtracting the detection temperature $T_2$ of the temperature sensor 33 from the detection temperature $T_1$ of the temperature sensor 30 may be substituted into the previously mentioned equation (1) as the amount of variation $\Delta T$ in temperature caused by the application of light energy.

Figure 6:
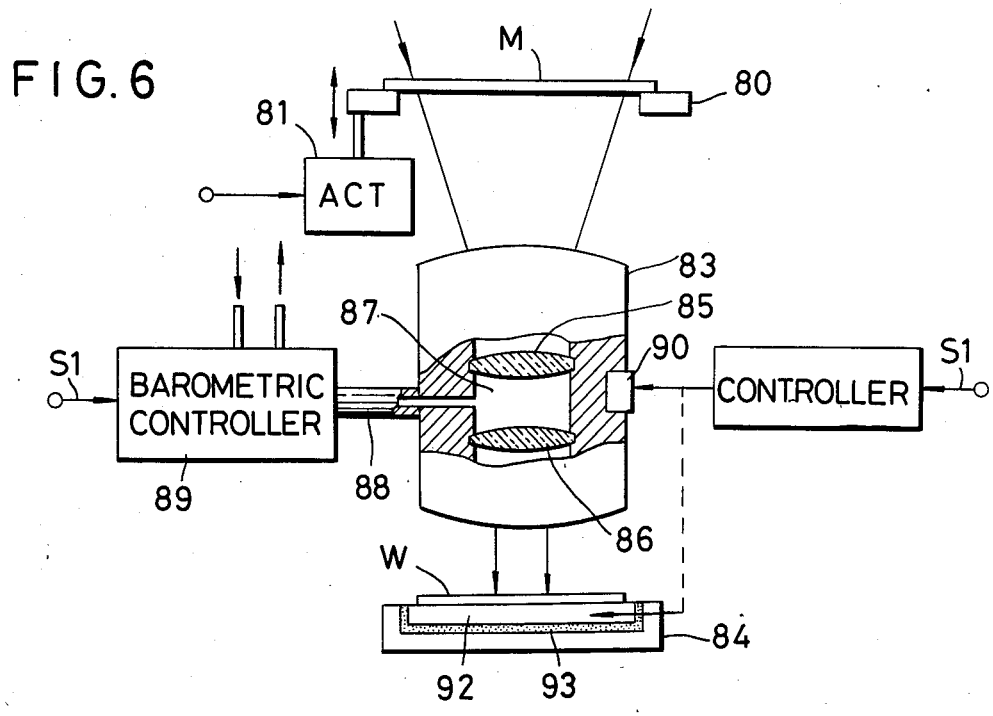
FIG. 6 is a schematic view showing an embodiment of the device for correcting the movement of the image plane and the variation in magnification.

The above-described embodiment is constructed so as to correct the movement of the imaging plane caused by a variation in temperature. However, the projection lens has a characteristic that its magnification is also varied by the incidence of the exposure light. It has been confirmed by an experiment as well that the variation characteristic of the magnification has just the same tendency as the characteristic of the image plane movement and the time constant thereof is the same as that of the latter. However, the constant K differs. Accordingly, the amount of variation $\Delta T$ detected by the temperature sensor 30 is in a primary relation with the amount of variation $\Delta M$ in the magnification of the projection lens. The amount of variation $\Delta M$ in the magnification represents the amount of expansion or contraction from the original size of the pattern image projected onto the wafer. So, several embodiments in which the variation in the magnification or the movement of the image plane is corrected by the use of the temperature sensor 30 will hereinafter be described by reference to FIG. 6.

Where that side of a projection lens 83 which is adjacent to the mask is a non-telecentric optical system, if a mask stage 80 holding the mask M thereon is vertically moved in the direction of the optic axis by an actuator 81, the size of the projected image on the wafer W will expand or contract. In this case, the position of the imaging plane also fluctuates and therefore, it is necessary to correct it by vertically moving the wafer W in accordance with the amount of vertical movement of the mask M. An air space 87 sandwiched between particular lens elements 85 and 86 of a plurality of lens elements constituting the projection lens 83 is made into an air-tight space isolated from the atmosphere, and the variation in the magnification and the movement of the image plane can also be corrected by controlling the pressure of the gas in this space 87 by a barometric controller 89 through a pipe 88. The method of thus varying the pressure of the air-tight space in the projection lens does not require any mechanical movement and therefore is capable of accomplishing highly accurate correction.

As an alternative method, a temperature controller 90 such as a heater wire or a Peltier element may be provided on the inner wall of the barrel of the projection lens and the design may be such that the temperature of the barrel is controlled in conformity with the amount of variation $\Delta T$ in temperature detected by the temperature sensor 30. In this case, it is necessary to find in advance the relation between the temperature of the projection lens itself and each of the amounts of variation $\Delta F$ and $\Delta M$ as by an experiment and determine the constant.

As a further alternative method, a planar temperature control element 92 may be provided within the wafer holder 84 through an adiabatic material 93 and the design may be such that the wafer W is vacuum-adsorbed onto the temperature control element 92. The temperature of the temperature control element 92 may be controlled in accordance with the amount of variation $\Delta T$ in temperature so that the wafer itself may be expanded or contracted. In this case, solely the correction of the variation in the magnification is achieved.

Figure 7:
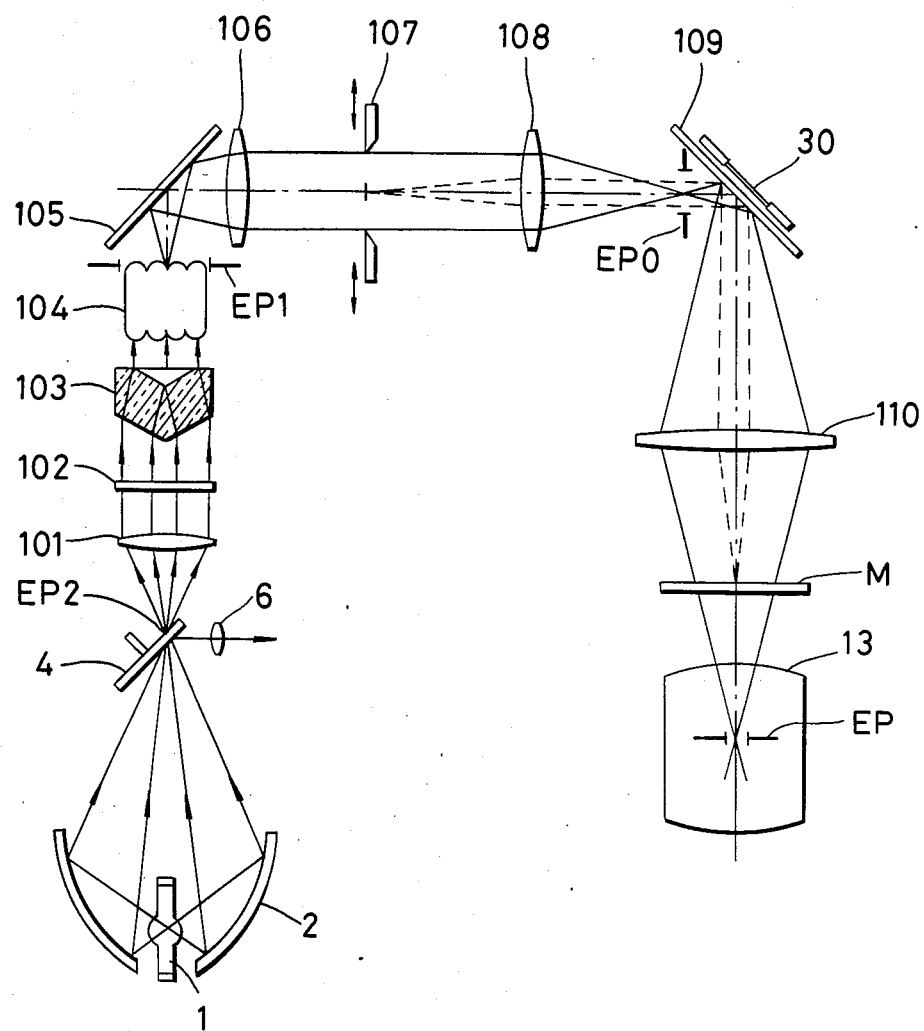
FIG. 7 shows the construction of the illuminating optical system of a projection type exposure apparatus according to a second embodiment of the present invention.

A second embodiment of the present invention is shown in FIG. 7. The optical system of FIG. 7 represents the illuminating optical system from the light source 1 to the entrance pupil EP of the projection lens 13, and the basic construction thereof is the same as that of the illuminating optical system of FIG. 1, with the exception that the elliptical reflecting mirror 2 is vertically reversed to make the blind 12 into a projection type and the temperature sensor 30 is disposed rearwardly of the blind 12. In FIG. 7, the illuminating light converged by the elliptical reflecting mirror 2 and passed through the shutter 4 is collimated by an input lens 101, whereafter it enters an interference filter 102 which selectively transmits therethrough only the light of a wavelength for exposure and a cone prism 103 for correcting the annular light intensity distribution peculiar to the elliptical reflecting mirror. The details of the cone prism 103 are shown in U.S. Pat. No. 4,498,742. Thereafter, the illuminating light passes through an optical integrator 104 and a dichroic mirror 105 which are similar to those shown in FIG. 1, and is collimated by a first relay lens 106. The illuminating light illuminates a blind 107 having a function similar to that of a field stop. The light passed through the opening of the blind 107 passes through a second relay lens 108, a dichroic mirror 109 and a condenser lens 110 and illuminates the mask M with a uniform intensity of light. The dichroic mirror 109 has an optical performance equal to that of the dichroic mirror 105 and bends the optical path at a right angle. In the optical path of the optical system of FIG. 7, the solid lines indicate the conjugate relation between the position of the point source of light image of the light source 1, i.e., the second focus $EP_2$, and the entrance pupil EP of the projection lens system 13, and the broken lines indicate the conjugate relation between the blind 107 and the mask M. Thus, the image of the opening of the blind 107 is projected onto the mask M. The second focus $EP_2$ positioned on the shutter 4 is determined so as to be conjugate with the exit surface $EP_1$ of the optical integrator 104, the exit surface $EP_1$ is determined so as to be conjugate with the pupil $EP_0$ in the illuminating optical system formed forwardly of the second relay lens 108, and further the pupil $EP_0$ is determined so as to be conjugate with the entrance pupil EP of the projection lens system 13.

In the present embodiment, the temperature sensor 30 is disposed on the back side of the optical member in the illuminating optical system which is nearest to the pupil $EP_0$, i.e., the dichroic mirror 109, in a manner similar to that described in connection with FIG. 1. On the pupil $EP_0$, all the information of the illuminating light after being passed through the blind 107 is concentrated at each point in the pupil $EP_0$. Thus, the concentrated light energy is transmitted to the back side of the dichroic mirror 109. Accordingly, the detection accuracy will not be reduced even if there is more or less error in the arrangement of the temperature sensor 30. In the optical path of FIG. 7, it will be more effective if the position of the dichroic mirror 109 is made accurately coincident with the position of the pupil $EP_0$.

According to the present embodiment, as described above, the temperature sensor 30 detects the temperature on the basis of the light energy passed through the blind 107 and thus, the temperature information includes, in addition to the information of the intensity of light 1 of the light source and the opening-closing duty of the shutter 4, the information regarding the area P of the pattern area of the mask M. That is, during the actual exposure, the opening of the blind 107 is adjusted so as to shield the area other than the pattern area of the mask from light and therefore, temperature detection is effected as if the saturation point of the temperature variation characteristic became correspondingly smaller.

The temperature sensor 30 may lie at any position in the optical path in the illuminating optical system from the light source 1 to the projection lens 13 that receives the light energy from the light source. However, desirably, the temperature sensor 30 may be disposed in the optical path from the shutter 4 to the projection lens 13. More specifically, such an arrangement of the temperature sensor 30 which will directly detect any variation in the temperature of the shutter 4 itself, such an arrangement of the temperature sensor which will receive the light energy entering the illuminating optical system 6 to the alignment microscope, or such an arrangement of the temperature sensor which will directly detect any variation in the temperature of the input lens 7, 101, the optical integrator 8, 104, the output lens 9, the interference filter 102, the cone prism 103, the first and second relay lenses 106, 108 or the condenser lens 11, 110 can likewise be carried out.

Also, instead of the temperature sensor 30 of FIG. 7, a glass plate having a thin film resistance member evaporated at the position of the pupil $EP_0$ may be inserted. Of course, it is necessary to adjust the thermal time constant of the glass plate to the time constant of the image plane movement, the variation in the magnification, or the like. In this case, the light energy applied to the glass plate includes a light of exposure wavelength and therefore, temperature detection becomes possible in the same state as the state of the light energy entering the projection lens 13 and improved accuracy of measurement can be expected. The actual temperature detection is accomplished with the aid of the variation in resistance value by the utilization of the temperature dependency of the thin film resistance member. Also, the thin film resistance member may be evaporated on the blind 12 or 107 with an insulating layer interposed therebetween to detect any variation in the temperature of the blind, or alternatively, it may be evaporated directly on the dichroic mirror 10 or 109 to obtain a similar effect.

In each of the above-described embodiments of the present invention, a display device may be provided for displaying the amount of variation in imaging optical characteristic found from the temperature information detected by the temperature sensor. Also, the temperature of the beam splitter or the dichroic mirror for taking out the light beam for alignment which is disposed in the optical path between the mask M and the projection lens 13 may be detected by the thin film resistance member or the like. If this is done, the detected temperature information will include the information of the transmittance $\eta$ in the pattern area of the mask and the light-receiving element 34 will become unnecessary.

I claim:

1. An optical apparatus for forming on a predetermined plane an image of an object, comprising:
   means for holding said object;
   light source means for emitting radiation;
   an illuminating optical system for illuminating said object with radiation from said source;
   a projection optical system provided between said object and said predetermined plane to cause the illuminated object to be imaged on said plane, wherein an imaging characteristic of said projection optical system varies as a function of the manner in which said radiation heats said projection optical system;
   sensor means receiving radiation from said source and producing an output corresponding to a temperature of the sensor means, said sensor means having a temperature characteristic exhibiting a time variation substantially coincident with a time variation of said imaging characteristic of said projection optical system heated by said radiation; and
   means responsive to said output for producing an output signal corresponding to variation in said imaging characteristic of said projection optical system.

2. An optical apparatus according to claim 1, wherein said sensor means includes a member having said temperature characteristic and being heated by radiation from said source, and means for detecting a temperature of said member.

3. An optical apparatus according to claim 1, wherein said sensor means includes means for extracting part of said radiation from said illuminating optical system and means for receiving said part of said radiation.

4. An optical apparatus according to claim 1, wherein said illuminating optical system includes an optical member for separating a predetermined wavelength component from a remaining wavelength component of said radiation and directing said predetermined wavelength component to said projection optical system, and said sensor means is so disposed as to receive said remaining wavelength component.

5. An optical apparatus according to claim 1, wherein said illuminating optical system includes shutter means for intermittently passing radiation from said source to said object, and said sensor means includes means for extracting part of the radiation passed through said shutter means.

6. An optical apparatus according to claim 1, further comprising means for adjusting the image of said object on said predetermined plane in accordance with said output signal.

7. An optical apparatus according to claim 6, wherein said adjusting means includes means for varying the imaging characteristic of said projection optical system, and means for controlling said varying means in response to said output signal.

8. An optical apparatus for forming on a predetermined plane an image of an object, comprising:
   means for holding said object;
   light source means for emitting radiation;
   an illuminating optical system for illuminating said object with radiation from said source;
   a projection optical system provided between said object and said predetermined plane to cause the illuminated object to be imaged on said plane, wherein an imaging characteristic of said projection optical system varies as a function of the manner in which said radiation heats said projection optical system;
   said illuminating optical system including means for separating a predetermined wavelength component from a remaining wavelength component of said radiation and directing said predetermined wavelength component to said projection optical system;
   thermometric means including a temperature detecting element producing an output corresponding to a temperature detected thereby, said temperature detecting element being so disposed as to receive said remaining wavelength component; and
   means for producing an output signal corresponding to a variation in said imaging characteristic of said projection optical system in response to the output of said temperature detecting element.

9. An optical apparatus according to claim 8, wherein said separating means includes a dichroic mirror member disposed between said light source means and said projection optical system.

10. An optical apparatus according to claim 8, wherein the wavelength of said remaining wavelength component is longer than the wavelength of said predetermined wavelength component.

* * * * *